United States Patent
He et al.

(10) Patent No.: US 9,138,973 B1
(45) Date of Patent: Sep. 22, 2015

(54) METHOD FOR TRANSFERRING NANOSTRUCTURES

(71) Applicants: Tsinghua University, Beijing (CN); HON HAI PRECISION INDUSTRY CO., LTD., New Taipei (TW)

(72) Inventors: Yu-Jun He, Beijing (CN); Dong-Qi Li, Beijing (CN); Tian-Yi Li, Beijing (CN); Yang Wei, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/251,775

(22) Filed: Apr. 14, 2014

(30) Foreign Application Priority Data

Feb. 28, 2014 (CN) .......................... 2014 1 0070781

(51) Int. Cl.
| | |
|---|---|
| *H01L 21/20* | (2006.01) |
| *H01L 21/36* | (2006.01) |
| *H01L 21/30* | (2006.01) |
| *B05D 1/18* | (2006.01) |
| *B29C 65/00* | (2006.01) |
| *B32B 37/00* | (2006.01) |
| *B32B 37/12* | (2006.01) |
| *B32B 37/30* | (2006.01) |
| *B32B 38/08* | (2006.01) |

(52) U.S. Cl.
CPC ............... *B32B 37/025* (2013.01); *B32B 37/12* (2013.01); *B32B 37/30* (2013.01); *B32B 38/08* (2013.01); *B32B 2305/22* (2013.01); *B32B 2309/16* (2013.01); *B32B 2309/66* (2013.01); *B32B 2311/04* (2013.01); *B32B 2311/18* (2013.01); *B32B 2311/24* (2013.01); *B32B 2333/12* (2013.01); *B81C 2201/0191* (2013.01)

(58) Field of Classification Search
CPC ........... H01L 2224/05644; H01L 2224/05144; H01L 2224/05166; H01L 2224/03; H01L 2224/80006; H01L 2224/83005; H01L 2224/05666; H01L 2224/94; H01L 2224/80; H01L 21/02603; H01L 21/02521; H01L 21/02628; H01L 21/6835; H01L 21/0272; H01L 21/7813; H01L 2924/1461; H01L 2924/1579; H01L 33/0079; H01L 2221/68322; H01L 2221/6835; H01L 2221/68363; H01L 2221/68368; H01L 2221/68381; H01L 2221/68386; B81C 2201/0191; B82B 1/00; B82Y 40/00
USPC .................. 977/700; 156/230, 60; 427/430.1; 438/455, 478, 654
See application file for complete search history.

(56) References Cited

U.S. PATENT DOCUMENTS

2009/0298259 A1* 12/2009 Ling et al. ..................... 438/458

* cited by examiner

*Primary Examiner* — Chuong A Luu
*Assistant Examiner* — Cory Eskridge
(74) *Attorney, Agent, or Firm* — Novak Druce Connolly Bove + Quigg LLP (57) ABSTRACT

A method for transferring nanostructures includes providing a growth substrate and a number of nanostructures located on the growth substrate. The nanostructures are transferred by an adhesive layer from the growth substrate to a target substrate. The nanostructures are between the target substrate and the adhesive layer, and at least partial of nanostructures is in contact with a surface of the target substrate. The adhesive layer is covered by a metal layer. The adhesive layer together with the metal layer is separated from the nanostructures and the target substrate in an organic solvent by an external force, wherein the organic solvent permeates into an interface between the adhesive layer and the nanostructures.

20 Claims, 14 Drawing Sheets

METHOD FOR TRANSFERRING NANOSTRUCTURES

RELATED APPLICATIONS

This application claims all benefits accruing under 35 U.S.C. §119 from China Patent Application No. 201410070781.1, filed on Feb. 28, 2014, in the China Intellectual Property Office. This application is related to commonly-assigned application entitled, "METHOD FOR TRANSFERRING NANOSTRUCTURE", concurrently filed Ser. No. 14/251,768. Disclosures of the above-identified applications are incorporated herein by reference.

BACKGROUND

1. Technical Field

The present application relates to a method for transferring nanostructures.

2. Discussion of Related Art

It is well-known that growing nanostructures by chemical vapor deposition (CVD) highly depends on proper substrates. For example, horizontally aligned single-walled carbon nanotubes (SWCNTs) and large-area graphene of high quality can be grown on quartz substrates and copper foils by CVD, respectively. However, it is more desirable to fabricate electronic and optoelectronic devices with nanostructures on silicon wafers or flexible substrates. Thus, a transfer technology is proposed and developed to transfer the nanostructure from a growth substrate to a target substrate.

The transfer technology generally utilizes a sacrificial layer as the media. The sacrificial layer can be organic materials. The nanostructures on a growth substrate are first coated with the organic materials, an organic layer can be formed. Then the organic layer attached with the nanostructures is separated from the growth substrate and transferred to the target substrate. Finally the organic layer is removed by dissolving in acetone or by annealing in an argon atmosphere.

However, it may be difficult to completely remove residues of the organic layer from the nanostructures and the target substrate, which resulting in poor contact between the nanostructures and the post-fabricated metal electrodes. Moreover, removing the organic layer by annealing in an argon atmosphere cannot be applied to plastic substrates, because the plastic substrates cannot withstand high temperature.

What is needed, therefore, is to provide a method for transferring nanostructures that can overcome the above-described shortcomings.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
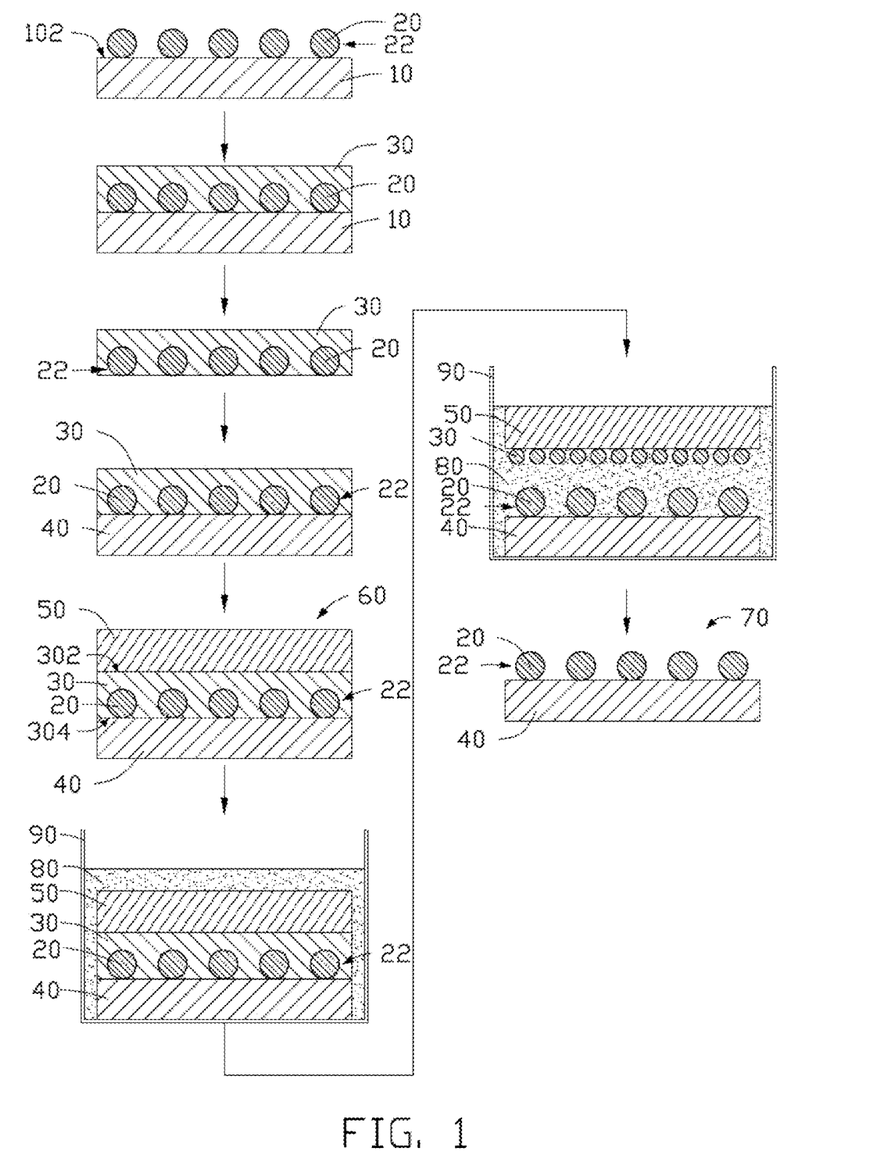
FIG. 1 is a schematic process flow of one embodiment of a method for transferring nanostructure.

Referring to FIG. 1, a method for transferring a nanostructure layer 22 of one embodiment includes steps of:

(S1), providing a growth substrate 10 having a nanostructure layer 22, wherein the nanostructure layer 22 including a plurality of nanostructures 20 is located on a top surface 102 of the growth substrate 10;

(S2), covering the nanostructure layer 22 by an adhesive layer 30;

(S3), separating the adhesive layer 30 from the growth substrate 10 through moving the adhesive layer 30 or/and the growth substrate 10, to separate the nanostructure layer 22 from the growth substrate 10;

(S4), stacking the adhesive layer 30 on a target substrate 40, wherein the nanostructure layer 22 is between the target substrate 40 and the adhesive layer 30, and the nanostructure layer 22 is in contact with a surface of the target substrate 40;

(S5), placing a metal layer 50 on the first surface 302 of the adhesive layer 30 to form a first composite substructure 60; and (S6), placing the first composite substructure 60 in an organic solvent 80, and separating the adhesive layer 30 together with the metal layer 50 from the nanostructure layer 22 and the target substrate 40, wherein the organic solvent 80 permeates into an interface between the adhesive layer 30 and the nanostructure layer 22.

In the step (S1), the top surface 102 of the growth substrate 10 can be flat and smooth. The growth substrate 10 can be a P-type silicon substrate, an N-type silicon substrate, or a silicon substrate having oxide layer disposed thereon. In one embodiment, the growth substrate 10 is made of quartz.

The plurality of nanostructures 20 can be directly grown on the top surface 102 of the growth substrate 10. The plurality of nanostructures 20 can be pasted or paved on the top surface 102 of the growth substrate 10. The plurality of nanostructures 20 can be parallel or perpendicular to the top surface 102 of the growth substrate 10. An angle can be formed between the plurality of nanostructures 20 and the top surface 102 of the growth substrate 10. A thickness of the nanostructure layer 22 can be less than or equal to 1 micron. There can be a distance between two adjacent nanostructures 20. The plurality of nanostructures 20 can closely arrange, thus there is no distance between two adjacent nanostructures 20.

The plurality of nanostructures 20 can be nanomaterial, such as carbon nanotube or graphite. In one embodiment, the plurality of nanostructures 20 is a plurality of single walled carbon nanotubes parallel to the top surface 102 of the growth substrate 10. A method for making the plurality of single walled carbon nanotubes is arbitrary.

Figure 2:
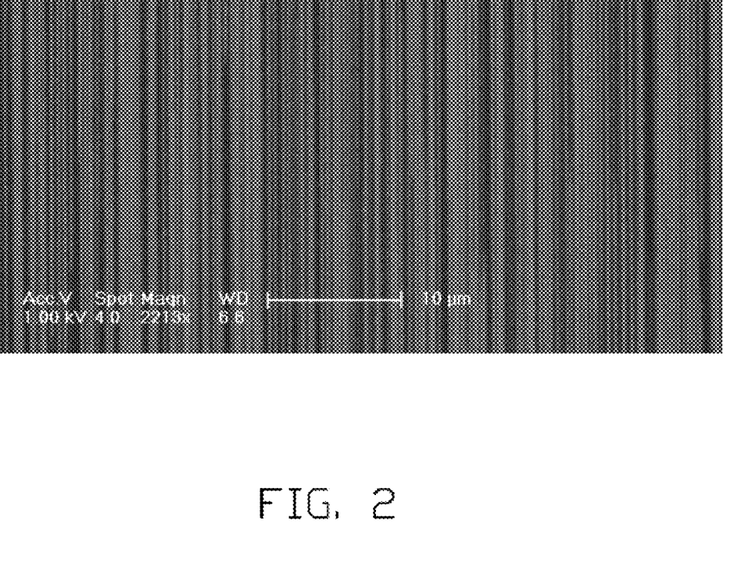
FIG. 2 shows a scanning electron microscope image of single walled carbon nanotubes.
Figure 3:
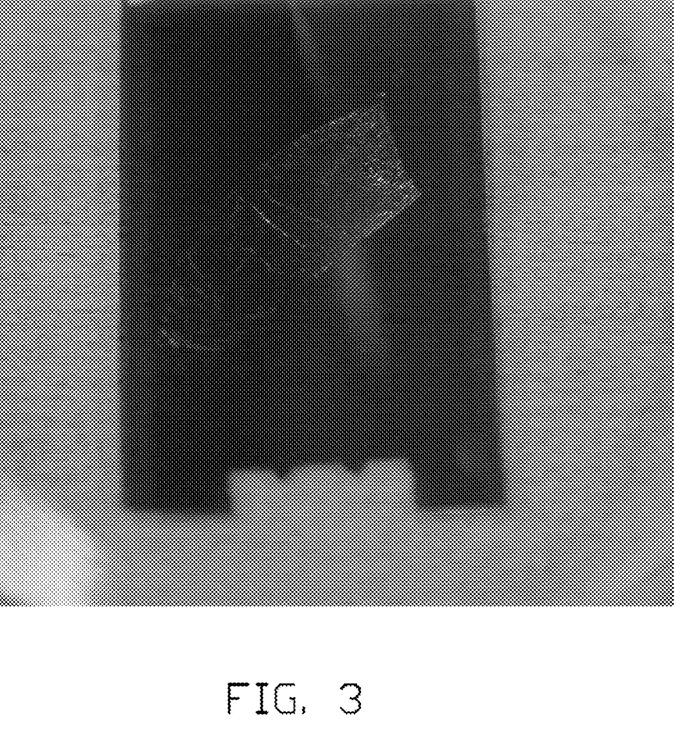
FIG. 3 is an optical microscope image of one embodiment of placing a first composite substructure in an organic solvent for 30 s.
Figure 4:
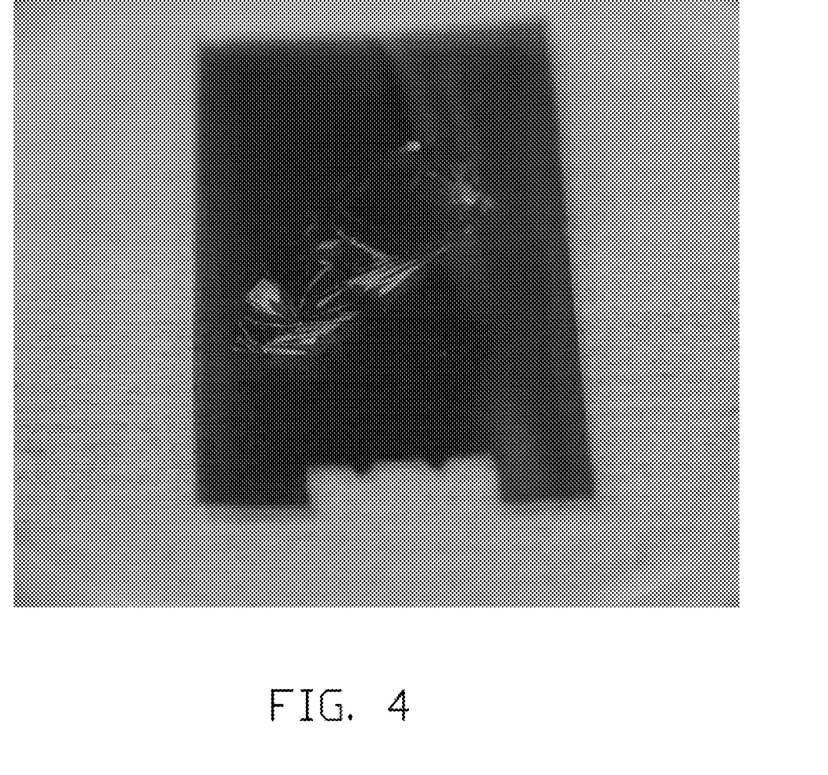
FIG. 4 is an optical microscope image of one embodiment of placing the first composite substructure in the organic solvent for 60 s.
Figure 5:
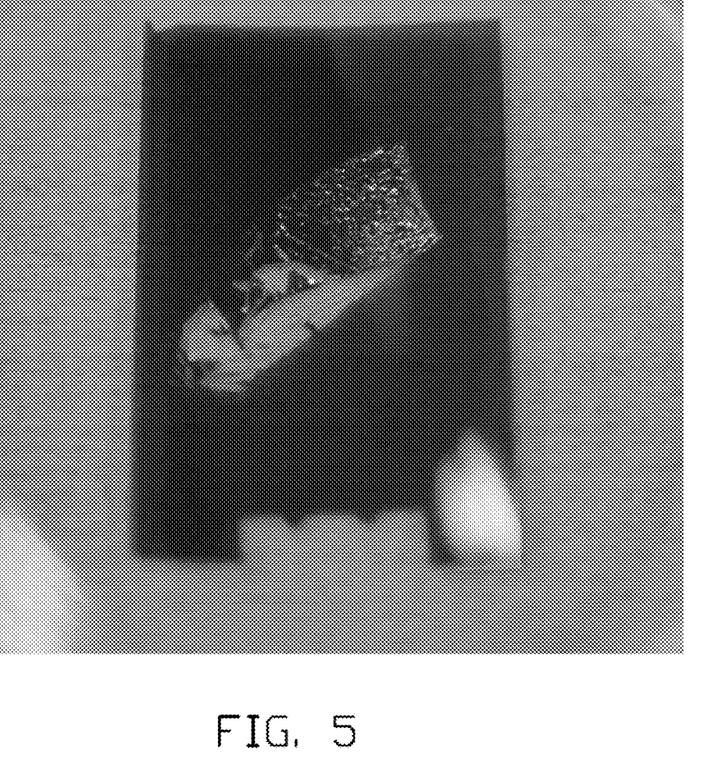
FIG. 5 is an optical microscope image of one embodiment of placing the first composite substructure in the organic solvent for 90 s.
Figure 6:
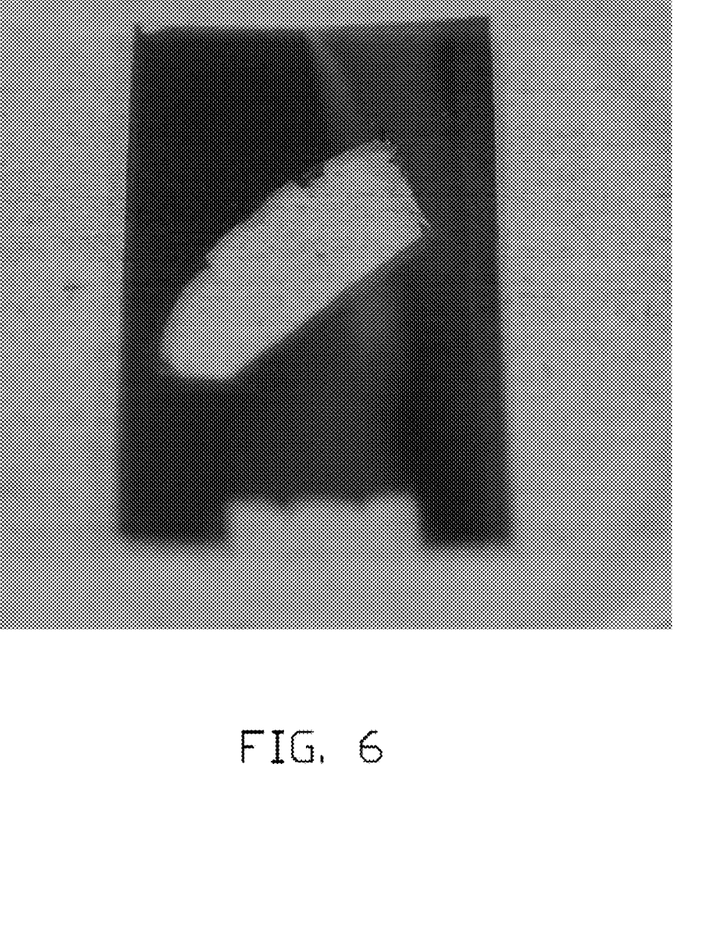
FIG. 6 is an optical microscope image of one embodiment of placing the first composite substructure in the organic solvent for 300 s.

In one embodiment, a method for making the plurality of single walled carbon nanotubes includes steps of:

(S11), annealing a stable temperature-cut (ST-cut) quartz substrate at 900° C. for 8 h in $O_2$;

(S12), depositing a catalyst film with a nominal thickness of 0.2 nanometers on a surface of the ST-cut quartz substrate by photolithography, wherein the catalyst film can be made of iron, cobalt, nickel, or any combination alloy thereof;

(S13), placing the ST-cut quartz substrate with the catalyst film in a furnace, and purging the furnace using 1000 standard cubic centimeter (sccm) of argon (Ar) after ramping up step in air to 700° C., and then introducing a flow of Ar (500 sccm) and hydrogen ($H_2$, 500 sccm); and (S14), growing the plurality of single walled carbon nanotubes at 850° C. with a flow of methane ($CH_4$, 500 sccm), $H_2$ (100 sccm) and Ar (400 sccm) for 15 min, wherein the plurality of single walled carbon nanotubes is as shown in FIG. 2.

In the step (S2), the adhesive layer 30 can be made of organic material, such as poly (methyl methacrylate) (PMMA), poly (dimethylsiloxane) (PDMS), or polyimide (PI). In one embodiment, the adhesive layer 30 is made of PMMA.

An organic material solution can be spin-coated onto a surface of the nanostructure layer 22 away from the growth substrate 10 and form the adhesive layer 30. In one embodiment, the surface of the nanostructure layer 22 away from the growth substrate 10 is spin-coated by PMMA solution and then baked at 120° C. for 2 min to form a dense film. When two adjacent nanostructures has the distance, the adhesive layer 30 can permeate into the distance and fill the distance.

The adhesive layer 30 needs to be a continuous film and cover the nanostructure layer 22 or cover each of the plurality of nanostructures 20. A thickness of the adhesive layer 30 can be selected according to need. The thickness of the adhesive layer 30 can be in a range from about 100 microns to about 300 microns. In one embodiment, the thickness of the adhesive layer 30 is in a range from about 150 microns to about 250 microns. In one embodiment, the thickness of the adhesive layer 30 is 190 microns.

In the step (S3), the adhesive layer 30 is viscous. A combine force between the adhesive layer 30 and the nanostructure layer 22 is greater than a combine force between the nanostructure layer 22 and the growth substrate 10. Therefore, the adhesive layer 30 together with the nanostructure layer 22 is stripped from the growth substrate 10, wherein the nanostructure layer 22 is pasted on the adhesive layer 30.

In detail, the adhesive layer 30 is gradually stripped from the growth substrate 10 by moving the adhesive layer 30 or/and the growth substrate 10. The nanostructure layer 22 is also separated from the growth substrate 10 because the nanostructure layer 22 is pasted on the adhesive layer 30. At least partial of the plurality of nanostructures 20 is exposed out of the adhesive layer 30.

A method for separating the adhesive layer 30 together with the nanostructure layer 22 from the growth substrate 10 can be chemistry or physics method, such as cauterizing and removing the growth substrate 10 by a chemical solution, or separating the adhesive layer 30 together with the nanostructure layer 22 from the growth substrate 10 by a mechanical force. In one embodiment, the adhesive layer 30 together with the nanostructure layer 22 is separated from the growth substrate 10 in NaOH aqueous solution in 100° C. A molar concentration of the NaOH aqueous solution is 1 mol/L.

In the step (S4), a material and size of the target substrate 40 can be selected according to need. The material of the target substrate 40 can be silicon, silicon dioxide, or soft polymer. When the target substrate 40 is made of polyethylene glycol terephthalate (PET), a thickness of the target substrate 40 can be about 70 microns. In one embodiment, the target substrate 40 is made of silicon, a surface of the silicon target substrate 40 is oxidized to a silicon dioxide layer with a thickness of 300 nanometers.

The adhesive layer 30 is directly pasted on a surface of the target substrate 40, and the plurality of nanostructures 20 is between the adhesive layer 30 and the target substrate 40. At least partial of the plurality of nanostructures 20 exposed out of the adhesive layer 30 is directly contacted with the surface of the target substrate 40.

In the step (S5), the adhesive layer 30 has a first surface 302 away from the target substrate 40, and a second surface 304 opposite to the first surface 302 and close to the target substrate 40. The metal layer 50 is deposited on the first surface 302 of the adhesive layer 30 by electron-beam evaporation. A material of the metal layer 50 can be selected according to need, such as Au, Ti, Al or Gr. The first surface 302 of the adhesive layer 30 is totally covered by the metal layer 50, thus the metal layer 50 needs to be a continuous film. Side surfaces of the adhesive layer 30 are not covered by the metal layer 50.

The metal layer 50 cannot totally cover the adhesive layer 30 if the metal layer 50 is too thin. The adhesive layer 30 can hardly be fully removed from the nanostructure layer 22 or the target substrate 40 if the metal layer 50 is too thick. Therefore, a thickness of the metal layer 50 can be in a range from about 10 nanometers to about 50 nanometers. In one embodiment, the thickness of the metal layer 50 is in a range from about 10 nanometers to about 25 nanometers. In one embodiment, the metal layer 50 is a Ti film with a thickness of 20 nanometers.

The first composite structure 60 includes the target substrate 40, the nanostructure layer 22 located on the target substrate 40, the adhesive layer 30 located on the nanostructure layer 22, and the metal layer 50 located on the first surface 302 of the adhesive layer 30. The nanostructure layer 22 is between the target substrate 40 and the second surface 304 of the adhesive layer 30.

In the step (S6), a contact between the second surface 304 of the adhesive layer 30 and the nanostructure layer 22 or the target substrate 40 is relatively weaker than a contact between the first surface 302 of the adhesive layer 30 and metal layer 50. Therefore, when the first composite structure 60 is immersed in the organic solvent 80, the organic solvent 80 initiates from the second surface 304 of the adhesive layer 30. When the adhesive layer 30 near the second surface 304 is dissolved, the residual adhesive layer 30 can be fully peeled away from the target substrate 40 with the help of the metal layer 50, leaving clean nanostructure layer 22 on the target substrate 40.

On the one hand, the metal layer 50 is actually to prevent the dissolution of the adhesive layer 30 from the first surface 302 and to dissolve the adhesive layer 30 from the second surface 304; on the other hand, the metal layer 50 increases a mechanical strength of a metal-coated adhesive film. Thus, the adhesive layer 30 is removed in large block before the adhesive layer 30 is fully resolved into small pieces. Therefore, a transferred nanostructure layer 22 on the target substrate 40 is clean with little residue.

The organic solvent 80 can be located in a wide mouth container 90 and dissolve the adhesive layer 30, such as acetone, ether, or methyl alcohol. The metal layer 50 and the target substrate 40 are not dissolved by the organic solvent 80. In one embodiment, the organic solvent 80 is acetone. When the first composite structure 60 is immersed in the organic solvent 80 for a time ranged from about 3 min to about 10 min, the metal layer 50 together with the adhesive layer 30 is fully peeled off from the nanostructure layer 22 and the target substrate 40 without external force, to form a second composite structure 70.

Referring to FIGS. 3-6, the target substrate 40 is PET, the metal layer 50 is a Ti film with a thickness of 20 nanometers, the adhesive layer 30 is PMMA, when the first composite structure 60 is immersed in the organic solvent 80, with increasing of the time, the Ti film together with PMMA (Ti-coated PMMA) is gradually peeled from the nanostructure layer 22 and PET substrate. Ti-coated PMMA could be fully peeled off from the PET substrate after dipped into acetone solution for 5 min.

Figure 7:
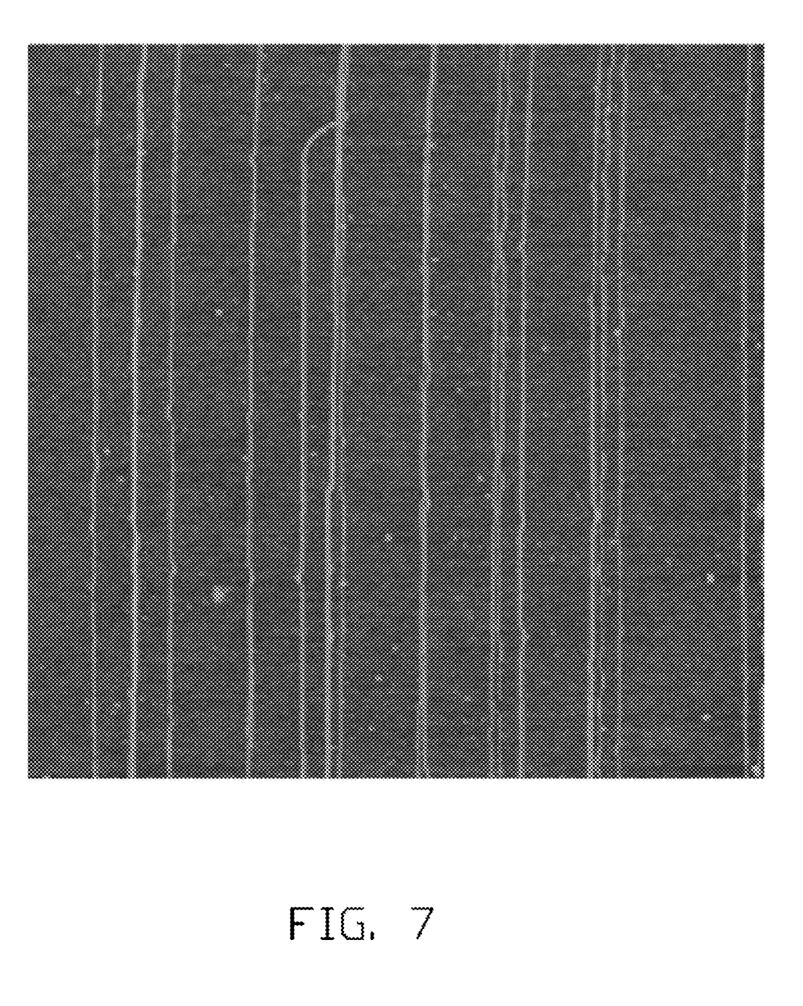
FIG. 7 is an atomic force microscope image of one embodiment of a second composite substructure.
Figure 8:
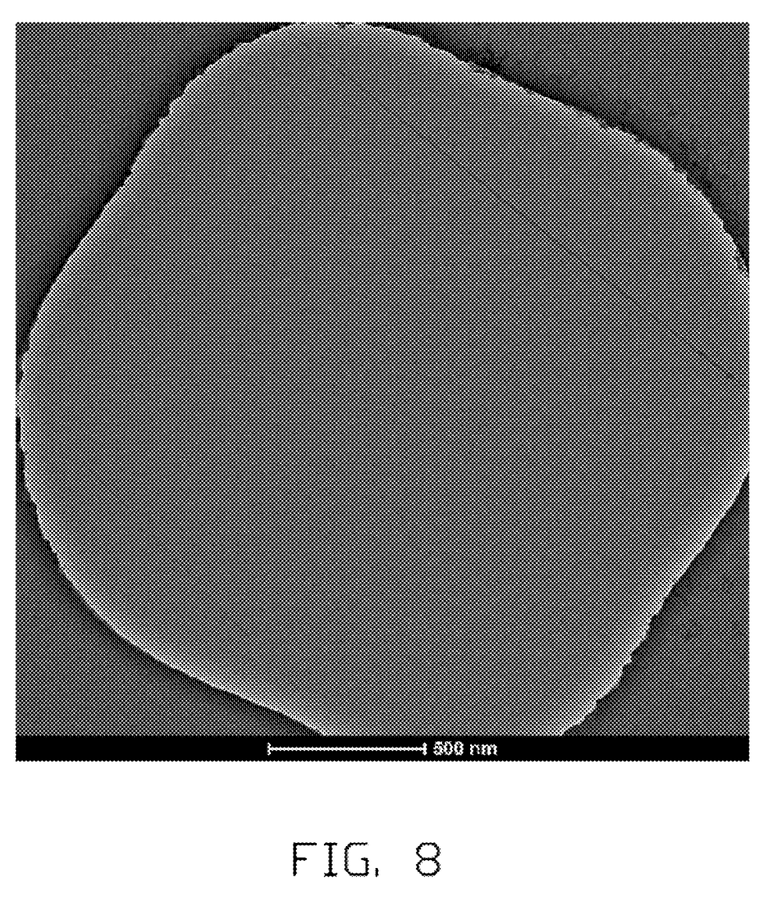
FIG. 8 is a transmission electron microscope image of one embodiment of the second composite substructure.
Figure 9:
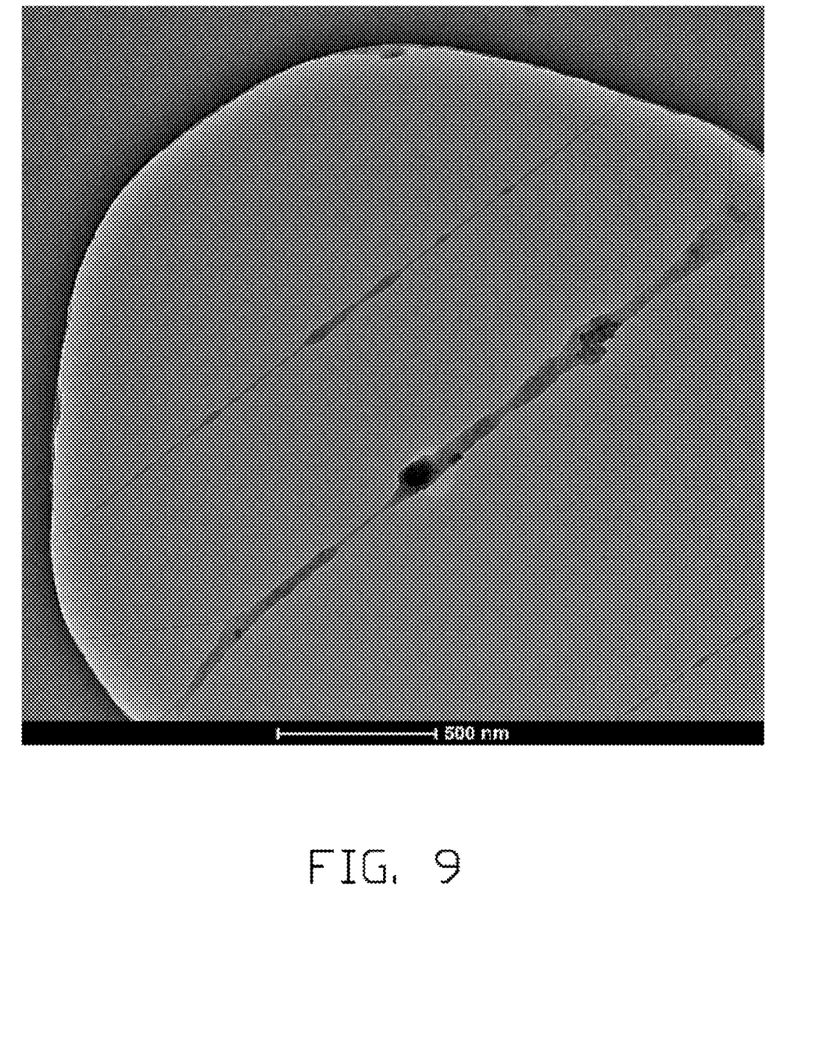
FIG. 9 is a transmission electron microscope image of a substructure including the target substrate and the nanostructure layer transferred by conventional method.

The second composite structure 70 includes the target substrate 40 and the plurality of nanostructures 20 located on a surface of the target substrate 40. The plurality of nanostructures 20 and the target substrate 40 are clean with little metal and adhesive residue, as shown in FIGS. 7 and 8. On the contrary, as shown in FIG. 9, there is residue in a substructure including the target substrate 40 and the nanostructure layer 22 transferred by a conventional method.

The metal layer 50 can be a resistant layer for preventing the first surface 302 of the adhesive layer 30 from directly contacting with the organic solvent 80. The resistant layer prevents dissolution of the adhesive layer 30 from the first surface 302. A material of the resistant layer can be not dissolved by the organic solvent 80 and not restricted to metal.

In addition, placing the metal layer 50 on the first surface 302 of the adhesive layer 30 can be omitted. After transferring the nanostructure layer 22 on the target substrate 40 from the growth substrate 10 by the adhesive layer 30, the nanostructure layer 22 is between the target substrate 40 and the adhesive layer 30. The nanostructure layer 22 is in contact with the second surface 304 of the adhesive layer 30. And then, the organic solvent 80 is dipped into the interface between the adhesive layer 30 and the nanostructure layer 22 by a tool, such as dropper, funnel. The organic solvent 80 initiates from the second surface 304 of the adhesive layer 30. The adhesive layer 30 is peeled off from the nanostructure layer 22 and the target substrate 40, leaving clean nanostructure layer 22 on the target substrate 40.

An embodiment of the method for transferring the nanostructure layer 22 is shown where the thickness of the metal layer 50 is greater than or equal to 10 nanometers, and after placing the first composite structure 60 in the organic solvent 80, the metal layer 50 together with the adhesive layer 30 is separated from the nanostructure layer 22 and the target substrate 40 by an external force, such as a mechanical force, surface tension and buoyancy of water.

The metal layer 50 needs to be the continuous film and cover the nanostructure layer 22 or cover each of the plurality of nanostructures 20. In one embodiment, the thickness of the metal layer 50 is in a range from about 15 nanometers to about 125 nanometers. In one embodiment, the metal layer 50 is an Au film with a thickness of 50 nanometers.

When the external force is the mechanical force, after placing the first composite structure 60 in the organic solvent 80, entire surface of the metal layer 50 away from the adhesive layer 30 is pulled by a uniform upward force, or/and entire surface of the target substrate 40 away from the nanostructure layer 22 is pulled by a uniform downward force. Therefore, the metal layer 50 together with the adhesive layer 30 is separated from the nanostructure layer 22 and the target substrate 40. The force can be provided by a tool, such as vacuum chuck.

When the external force is surface tension and buoyancy of water, the organic solvent 80 needs to have poor mutual solubility with water, such as acetone. In one embodiment, the organic solvent 80 is acetone.

Figure 10:
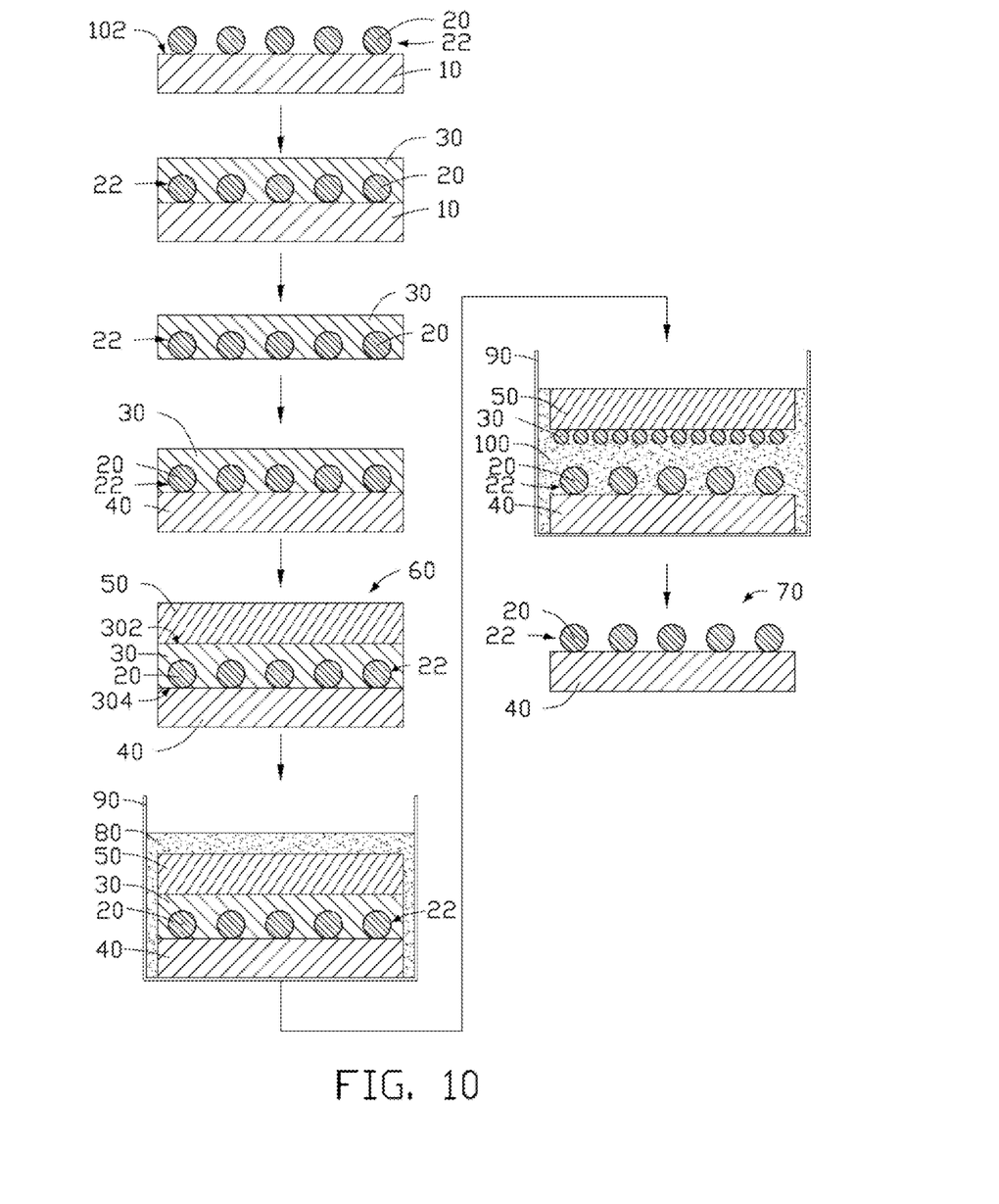
FIG. 10 is a schematic process flow of another embodiment of a method for transferring nanostructure.

Referring to FIG. 10, the first composite structure 60 is placed in the organic solvent 80, a multitude of wrinkles appeared on a surface of a metal/adhesive film, wherein the metal/adhesive film is a whole structure formed by the metal layer 50 and the adhesive layer 30. The formation of there wrinkles can be attributed to partial and uneven separation between metal/adhesive film and the target substrate 40 induced by the organic solvent 80 dissolving and penetration. And then, the first composite structure 60 is soaked into water 100 after taking out from the organic solvent 80, the whole wrinkled film can be directly peeled off from the nanostructure layer 22 and the target substrate 40. The separation in water 100 is caused by the surface tension from water 100 and the low solubility between the organic solvent 80 and water 100. Finally, the metal/adhesive film and the organic solvent 80 are removed, to obtain the second composite structure 70 after drying. Wherein, the water 100 can be located in the wide mouth container 90.

Furthermore, this method can be applied transfer the plurality of nanostructures 20 grown on the growth substrates 10 with relatively rough surface, such as graphene on copper foils, because on those relatively rough substrates, a thicker metal layer 50 is required to form a continuous film.

Figure 11:
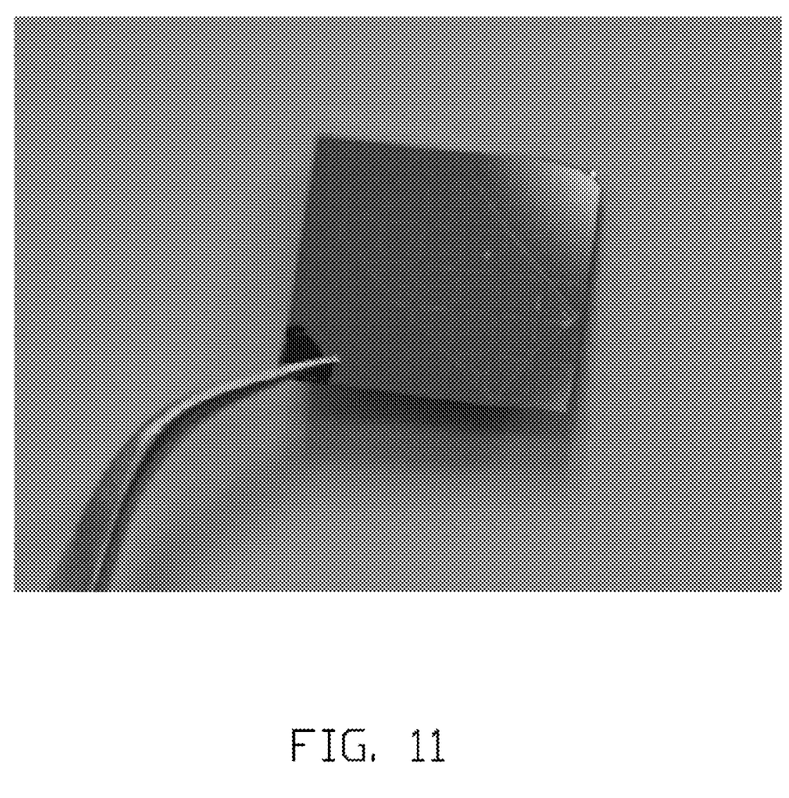
FIG. 11 is an optical microscope image of another embodiment of the first composite substructure in air.
Figure 12:
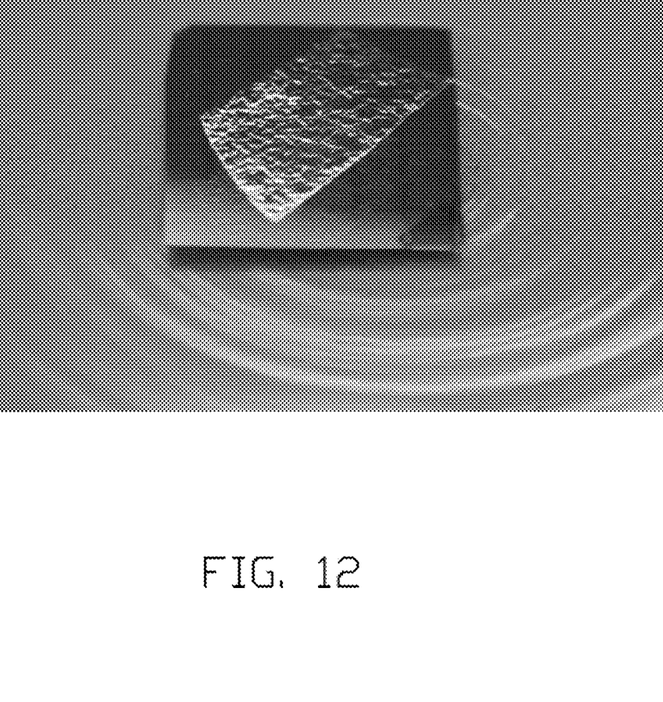
FIG. 12 is an optical microscope image of another embodiment of the first composite substructure in acetone.
Figure 13:
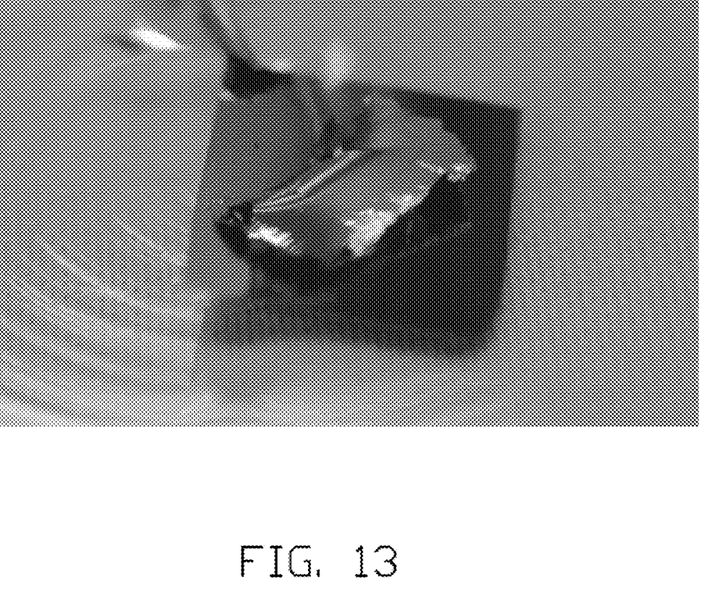
FIG. 13 is an optical microscope image of another embodiment of the first composite substructure socked into water after taking out from the acetone of FIG. 12.

FIGS. 11-13 show shapes of the metal/adhesive film of the first composite structure 60, wherein the metal layer 50 is the Au film with the thickness of 50 nanometers, the adhesive layer 30 is PMMA, the organic solvent 80 is acetone, and the metal/adhesive film is Au/PMMA film. In air, the Au/PMMA film is flat and smooth, as shown in FIG. 11. In acetone, the multitude of wrinkles appeared on a surface of the Au/PMMA film, as shown in FIG. 12. In water, whole wrinkled Au/PMMA film can be directly peeled off from the nanostructure layer 22 and the target substrate 40, as shown in FIG. 13.

Figure 14:
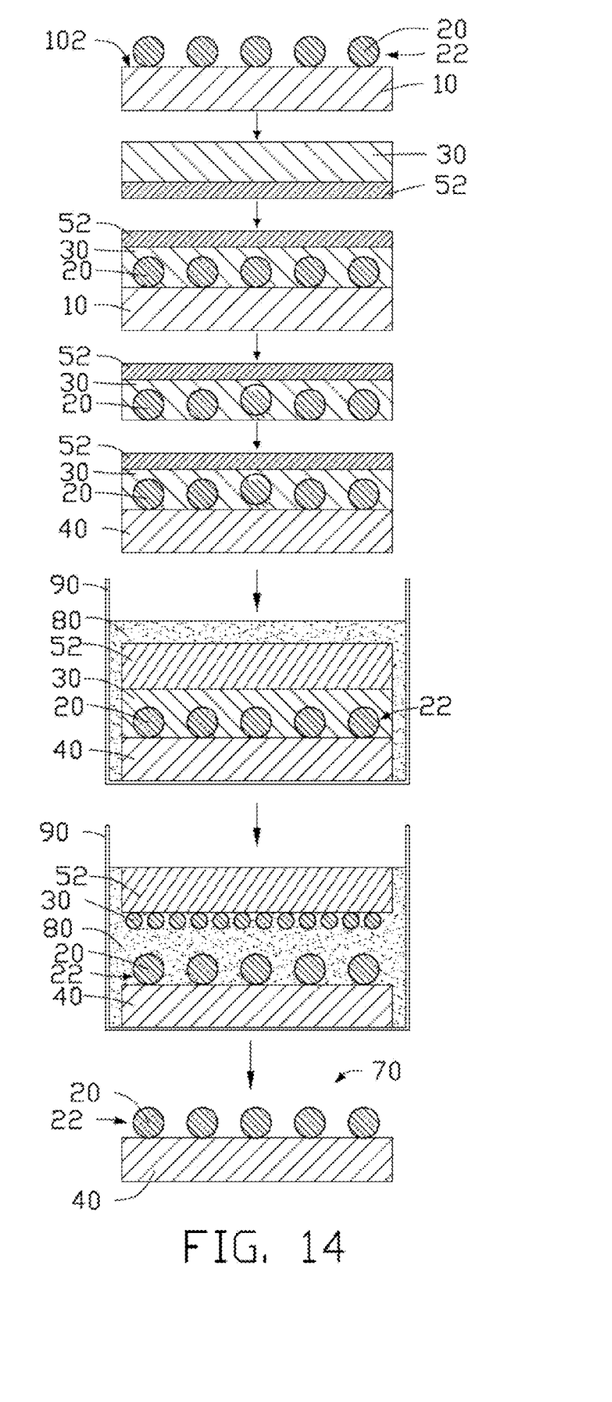
FIG. 14 is a schematic process flow of yet another embodiment of a method for transferring nanostructure.

Referring to FIG. 14, a method for transferring the nanostructure layer 22 of one embodiment includes steps of:

(S1'), providing a growth substrate 10 having a top surface 102, wherein the nanostructure layer 22 including a plurality of nanostructures 20 is located on the top surface 102 of the growth substrate 10;

(S2'), locating an adhesive layer 30 on a base 52;

(S3'), contacting the adhesive layer 30 with the nanostructure layer 22, wherein the adhesive layer 30 and the nanostructure layer 22 are between the base 52 and the growth substrate 10;

(S4'), separating the adhesive layer 30 from the growth substrate 10 through moving the base 52 or/and the growth substrate 10, to separate the nanostructure layer 22 from the growth substrate 10;

(S4'), stacking the adhesive layer 30 on a target substrate 40, wherein the nanostructure layer 22 is between the target substrate 40 and the adhesive layer 30, and the nanostructure layer 22 is in contact with the second surface 304 of the adhesive layer 30 and a surface of the target substrate 40; and (S5'), separating the adhesive layer 30 together with the base 52 from the nanostructure layer 22 and the target substrate 40 by an external force in an organic solvent 80, wherein the organic solvent 80 permeates into an interface between the adhesive layer 30 and the nanostructure layer 22.

This embodiment of the method for transferring the nanostructure layer 22 is shown where the metal layer 50 is replaced by the base 52, and the adhesive layer 30 together with the base 52 is separated from the nanostructure layer 22 and the target substrate 40 by the external force in the organic solvent 80.

In the step (S2'), the base 52 cannot be dissolved by the organic solvent 80. A material of the base 52 can be metal, such as Au, Ti, Al or Gr. The adhesive layer 30 can be formed by spin-coating the organic material onto the base 52. A thickness of the base 52 is greater than or equal to 10 nanometers.

In the step (S5'), on the one hand, the base 52 is actually to prevent the dissolution of the adhesive layer 30 from the first surface 302 and to dissolve the adhesive layer 30 from the second surface 304; on the other hand, the base 52 increases a mechanical strength of the adhesive layer 30. Thus, the adhesive layer 30 is resolved in large block before the adhesive layer 30 is fully resolved into small pieces. Finally, the base 52 together with the adhesive layer 30 in large block is separated from the nanostructure layer 22 and the target substrate 40 by the external force. Therefore, a transferred nanostructure layer 22 on the target substrate 40 is clean with little residue. The external force can be the surface tension and buoyancy of water or the mechanical force.

In summary, the plurality of nanostructures 20 is transferred on the target substrate 40 by the adhesive layer 30. And then the organic solvent 80 permeates into the interface between the adhesive layer 30 and the plurality of nanostructures 20. The adhesive layer 30 is dissolved from the second surface 302, to make transferred nanostructures 20 on the target substrate 40 be clean with little residue. The method is not need high temperature and can be implemented in room temperature. Moreover, the method is simple.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. A method for transferring nanostructures comprising:
   providing a plurality of nanostructures on a growth substrate;
   covering the plurality of nanostructures with an adhesive layer;
   separating the plurality of nanostructures from the growth substrate by moving the adhesive layer or the growth substrate until the plurality of nanostructures are partially exposed out of the adhesive layer;
   stacking the adhesive layer on a target substrate by sandwiching the plurality of nanostructures between the target substrate and the adhesive layer and placing exposed portions of the plurality of nanostructures in contact with the target substrate;
   covering the adhesive layer with a metal layer to form a composite substructure; and
   separating the adhesive layer and the metal layer from the plurality of nanostructures and the target substrate by permeating an organic solvent between the adhesive layer and the plurality of nanostructures and an external force.

2. The method of claim 1, comprising covering a surface of the adhesive layer away from the target substrate completely by the metal layer.

3. The method of claim 1, comprising forming the plurality of nanostructures into a nanostructure layer, a thickness of the nanostructure layer being less than or equal to 1 micron.

4. The method of claim 1, comprising forming the nanostructures comprising carbon nanotubes or graphites.

5. The method of claim 1, wherein a material of the metal layer is Au, Ti, Al or Gr.

6. The method of claim 1, wherein a thickness of the metal layer is greater than or equal to 10 nanometers.

7. The method of claim 1, wherein the metal layer is made of Au film with a thickness of 50 nanometers.

8. The method of claim 1, comprising placing the composite substructure in the organic solvent.

9. The method of claim 8, further comprising pulling an entire surface of the metal layer away from the adhesive layer with an uniform upward force.

10. The method of claim 8, further comprising pulling an entire surface of the target substrate away from the adhesive layer with an uniform downward force.

11. The method of claim 8, wherein the external force is surface tension and buoyancy of water.

12. The method of claim 11, further comprising forming a metal/adhesive film by the metal layer and the adhesive layer, the metal/adhesive film being a integral structure, taking the metal/adhesive film out of the organic solvent when wrinkles appear on the metal/adhesive film, and soaking the metal/adhesive film in water.

13. A method for transferring nanostructures comprising:
   providing a plurality of nanostructures on a growth substrate;
   transferring the plurality of nanostructures by an adhesive layer from the growth substrate to a target substrate by placing the plurality of nanostructures between the target substrate and the adhesive layer, and the plurality of nanostructures being partially in contact with the target substrate;
   covering the adhesive layer with a resistant layer to form a composite substructure; and
   providing an organic solvent capable of permeating between the adhesive layer and the plurality of nanostructures; and
   separating the adhesive layer and the resistant layer from the plurality of nanostructures and the target substrate by soaking the composite substructure into water after taking the composite substructure out of the organic solvent.

14. The method of claim 13, wherein the resistant layer is made of metal.

15. The method of claim 13, wherein a thickness of the resistant layer is greater than or equal to 10 nanometers.

16. The method of claim 13, wherein the nanostructures comprises carbon nanotubes or graphites.

17. The method of claim 13, further comprising forming a metal/adhesive film by the resistant layer and the adhesive layer, the metal/adhesive film being a integral structure, taking the composite substructure out of the organic solvent when wrinkles appear on the metal/adhesive film, and soaking the composite substructure in water.

18. The method of claim 13, wherein the organic solvent is acetone.

19. The method of claim 13, wherein the organic solvent is acetone, the adhesive layer is made of poly (methyl methacrylate), and the resistant layer is made of Au.

20. A method for transferring nanostructures comprising:
- providing a plurality of nanostructures on a growth substrate;
- placing an adhesive layer on a base;
- placing the adhesive layer in contact with the plurality of nanostructures, and sandwiching the adhesive layer and the plurality of nanostructures between the base and the growth substrate;
- separating the adhesive layer from the growth substrate, thereby separating the plurality of nanostructures from the growth substrate;
- stacking the adhesive layer on a target substrate by sandwiching the plurality of nanostructures between the target substrate and the adhesive layer, placing the plurality of nanostructures in contact with the target substrate; and
- separating the adhesive layer and the base from the plurality of nanostructures and the target substrate by an external force in an organic solvent, wherein the organic solvent permeates into an interface between the adhesive layer and plurality of nanostructures.

* * * * *